United States Patent
Stine

(10) Patent No.: US 10,897,814 B2
(45) Date of Patent: Jan. 19, 2021

(54) CHARACTERIZATION VEHICLES FOR PRINTED CIRCUIT BOARD AND SYSTEM DESIGN

(71) Applicant: PDF SOLUTIONS, INC., Santa Clara, CA (US)

(72) Inventor: Brian E. Stine, Santa Clara, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 0 days.

(21) Appl. No.: 16/717,668

(22) Filed: Dec. 17, 2019

(65) Prior Publication Data

US 2020/0120791 A1 Apr. 16, 2020

Related U.S. Application Data

(63) Continuation of application No. 16/162,072, filed on Oct. 16, 2018, now Pat. No. 10,517,169.

(60) Provisional application No. 62/657,039, filed on Apr. 13, 2018.

(51) Int. Cl.
*G06F 17/50* (2006.01)
*H05K 1/02* (2006.01)
*G01R 31/317* (2006.01)
*H03K 19/00* (2006.01)
*H01L 21/66* (2006.01)

(52) U.S. Cl.
CPC ......... *H05K 1/0268* (2013.01); *G01R 31/317* (2013.01); *H01L 22/34* (2013.01); *H03K 19/0016* (2013.01)

(58) Field of Classification Search
USPC .......... 716/118, 119, 122, 126, 136
See application file for complete search history.

(56) References Cited

U.S. PATENT DOCUMENTS

| | | | |
|---|---|---|---|
| 6,546,350 B1 * | 4/2003 | Hartmann | G07C 3/14 702/119 |
| 7,774,670 B2 * | 8/2010 | Markle | G01R 31/31721 714/31 |
| 2007/0083790 A1 * | 4/2007 | Nurmi | G06F 11/1004 714/12 |

(Continued)

OTHER PUBLICATIONS

"Length Equalization," Cadence Technology Forums. https://community.cadence.com/cadence_technology_forums/f/pcb-design/6663/length-equalization, 3 pages.

(Continued)

*Primary Examiner* — Brian Ngo
(74) *Attorney, Agent, or Firm* — Resonance IP Law, PC

(57) ABSTRACT

A characterization vehicle may include a first test circuit and a second test circuit located on separate panels of a panelized printed circuit (PC) board. The first test circuit may be fabricated in accordance with a first plurality of design parameters. The second test circuit may be fabricated in accordance with a second plurality of design parameters. The first plurality of design parameters and the second plurality of design parameters may be chosen in accordance with a design of experiment (DOE) concerning one or more design rules or design trade-offs such that at least two corresponding design parameters from the first and second test circuits have identical values, and at least two corresponding design parameters from the first and second test circuits have different values.

19 Claims, 16 Drawing Sheets

(56) References Cited

U.S. PATENT DOCUMENTS

2013/0219355 A1* 8/2013 Brown ............... G05B 19/05
717/106

OTHER PUBLICATIONS

Altera Corporation, "AN 574: Printed Circuit Board (PCB) Power Delivery Network (PDN) Design Methodology," May 2009.

Alzameli, Kamel, et al., "Optimization of Thermal Profile Process in Assembly Kine of Printed Circuit Boards (PCB) Using Design of Experiments," Proceedings of the 2016 International Conference on Industrial Engineering and Operations Management, Detroit, Michigan, USA, Sep. 23-25, 2016, pp. 1077-1086.

Chia, Chu-tien, et al., "A Study of PCB Insertion Loss Variation in Manufacturing Using a New Low Cost Metrology," IPC Apex Expo, Feb. 2012, 27 pages.

Hess, Christopher, et al., "Logic Characterization Vehicle to Determine Process Variation Impact on Yield and Performance of Digital Circuits," IEEE 2002 Int. Conference on Microelectronic Test Structures, vol. 15, Apr. 2002, 8 pages.

Hong, Sang Jeen, et al., "Process Optimization for Flexible Printed Circuit Board Assembly Manufacturing," (2012). Transactions on Electrical and Electronic Materials, vol. 13, No. 3, pp. 129-135, Jun. 25, 2012.

Huber, Oliver, et al., "Characterization of Printed Circuit Board Material & Manufacturing Technology for High Frequency," IPC APEX EXPO Conference Proceedings, 2015, 11 pages.

Khan, Zulki, "Bringing experimental development methods to PCB design and manufacturing," Dec. 3, 2014, https://www.embedded.com/print/4437850, 7 pages.

McDermott, Eva et al., "Long Term Thermal Reliability of Printed Circuit Board Materials," IPC APEX EXPO Conference Proceedings, 2015, 14 pages.

PCB Magazine, Sep. 2017, (entire magazine) 90 pages.

Qi, Haiyr et al., "Effects of Printed Circuit Board Materials on Lead-free Interconnect Durability," Polytronic 2005—5th International Conference on Polymers and Adhesives in Microelectronics and Photonics, pp. 140-144.

Rakov, Aleksei, "Wideband characterization of printed circuit board materials up to 50 GHz," (2013). Masters Theses. 7202. http://scholarsmine.mst.edu/masters_theses/7202.

Tsung, Fugee, et al., "A DMAIC approach to printed circuit board quality improvement," International Journal of Advanced Manufacturing Technology, Apr. 2004 23(7-8):523-531.

Wang, Lai Wang, et al., "Six-Sigma and Taguchi Approaches to the Printed Circuit Board Quality Improvement," Sciedu Press, Nov. 27, 2015, http://rwe.sciedupress.com, vol. 6, No. 4; 2015, pp. 29-52.

Wang, Paul et al., "Correlation of Solder Joint Reliability of µPGA Socket to Package Flatness and PCB Warpage," 2004, 17 pages.

* cited by examiner

Test Program 204

| Test Case | Input Vector | Expected Output Vector | Measured Output Vector | Functionality (Pass/Fail) |
|---|---|---|---|---|
| 1 | 00101011 | 10101111 | 10101111 | Pass |
| 2 | 01101001 | 10110101 | 10110100 | Fail |
| 3 | 00101101 | 11010010 | 11011011 | Fail |
| 4 | 01010101 | 01001010 | 01001010 | Pass |
| 5 | 11110000 | 11010101 | 11010101 | Pass |

Test Program 210

| Test Case | Input Vector | Expected Output Vector | Measured Output Vector | Functionality (Pass/Fail) |
|---|---|---|---|---|
| 1 | 00101011 | 10101111 | 10100111 | Fail |
| 2 | 01101001 | 10110101 | 10110101 | Pass |
| 3 | 00101101 | 11010010 | 11010010 | Pass |
| 4 | 01010101 | 01001010 | 01001010 | Pass |
| 5 | 11110000 | 11010101 | 11010101 | Pass |

Fig. 3

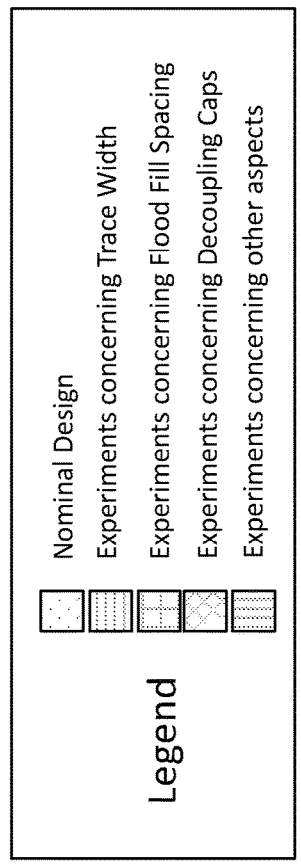

| Test Circuit | Design Specification |
|---|---|
| 1 | Nominal |
| 2 | Trace Width (top layer) -10% |
| 3 | Trace Width (bottom layer) -10% |
| 4 | Trace Width (top layer) +10% |
| 5 | Trace Width (bottom layer) +10% |
| 6 | Flood Fill Spacing (bottom layer, min spacing = 5mils) |
| 7 | Flood Fill Spacing (top layer, min spacing = 5mils) |
| 8 | Flood Fill Spacing (bottom layer, min spacing = 10mils) |
| 9 | Flood Fill Spacing (top layer, min spacing = 10mils) |
| 10 | Remove all decoupling caps except bulk decoupling |
| 11 | Remove bulk decoupling |
| 12 | Remove all decoupling >= 0.1uF |
| 13 | Remove all decoupling < 0.1uF |
| 14 | Add +/-10% randomly to lengths on equalized paths (top layer) |
| 15 | Add +/-10% randomly to lengths on equalized paths (bot. layer) |
| 16 | No ferrite beads |
| 17 | Oversize passive component pads by 10% |
| 18 | Undersize passive component pads by 10% |
| 19 | Oversize IC landing pads by 1mil |
| 20 | Undersize IC landing pads by 1mil |
| 21 | Inductor size -10% |

Fig. 9B

Results from Factory A

| Test Circuit | Design Specification | Func. Yield | Max Speed (MHz) | min IDDQ [nA] | Functional Yield (Vdd = -10%) | Functional Yield (Vdd = +10%) |
|---|---|---|---|---|---|---|
| 1 | Nominal | 99.2% | 236 | 3.78 | 99.3% | 99.2% |
| 2 | Trace Width (top layer) -10% | 87.3% | 240 | 3.79 | 99.3% | 99.5% |
| 3 | Trace Width (bottom layer) -10% | 98.9% | 243 | 3.86 | 99.3% | 99.3% |
| 4 | Trace Width (top layer) +10% | 99.3% | 246 | 3.86 | 99.4% | 99.4% |
| 5 | Trace Width (bottom layer) +10% | 99.1% | 251 | 3.79 | 99.4% | 99.5% |
| 6 | Flood Fill Spacing (bottom layer, min spacing = 5 mils) | 99.3% | 179 | 3.84 | 99.4% | 99.2% |
| 7 | Flood Fill Spacing (top layer, min spacing = 5 mils) | 99.3% | 153 | 3.80 | 99.4% | 99.2% |
| 8 | Flood Fill Spacing (bottom layer, min spacing = 10 mils) | 99.3% | 262 | 3.81 | 99.5% | 99.3% |
| 9 | Flood Fill Spacing (top layer, min spacing = 10 mils) | 99.3% | 279 | 3.83 | 99.5% | 99.3% |
| 10 | Remove all decoupling caps except bulk decoupling | 98.9% | 247 | 3.81 | 4.0% | 99.0% |
| 11 | Remove bulk decoupling | 99.1% | 247 | 3.87 | 98.7% | 99.2% |
| 12 | Remove all decoupling >= 0.1uF | 99.3% | 251 | 3.80 | 18.0% | 99.4% |
| 13 | Remove all decoupling < 0.1uF | 99.2% | 251 | 3.79 | 99.2% | 99.3% |
| 14 | Add +/-10% randomly to lengths on equalized paths (top layer) | 99.3% | 247 | 3.78 | 99.4% | 99.4% |
| 15 | Add +/-10% randomly to lengths on equalized paths (bottom layer) | 99.3% | 249 | 3.85 | 99.4% | 99.5% |
| 16 | No ferrite beads | 99.3% | 247 | 3.85 | 99.5% | 99.4% |
| 17 | Oversize passive component pads by 10% | 99.2% | 248 | 3.82 | 99.4% | 99.4% |
| 18 | Undersize passive component pads by 10% | 99.2% | 249 | 3.86 | 99.4% | 99.5% |
| 19 | Oversize IC landing pads by 1 mil | 99.3% | 247 | 3.87 | 99.5% | 99.5% |
| 20 | Undersize IC landing pads by 1 mil | 82.1% | 249 | 3.81 | 99.4% | 99.4% |
| 21 | Inductor size -10% | 99.3% | 248 | 231.32 | 99.4% | 99.3% |

Fig. 10A

Results from Factory B

| Test Circuit | Design Specification | Func. Yield | Max Speed (MHz) | min IDDQ [nA] | Functional Yield (Vdd = -10%) | Functional Yield (Vdd = +10%) |
|---|---|---|---|---|---|---|
| 1 | Nominal | 99.2% | 236 | 3.78 | 99.30% | 99.20% |
| 2 | Trace Width (top layer) -10% | 98.7% | 240 | 3.85 | 99.5% | 99.5% |
| 3 | Trace Width (bottom layer) -10% | 98.9% | 244 | 3.82 | 99.4% | 99.4% |
| 4 | Trace Width (top layer) +10% | 99.3% | 247 | 3.86 | 99.4% | 99.5% |
| 5 | Trace Width (bottom layer) +10% | 99.1% | 250 | 3.79 | 99.5% | 99.4% |
| 6 | Flood Fill Spacing (bottom layer, min spacing = 5 mils) | 99.4% | 232 | 3.85 | 99.5% | 99.2% |
| 7 | Flood Fill Spacing (top layer, min spacing = 5 mils) | 99.4% | 231 | 3.85 | 99.4% | 99.2% |
| 8 | Flood Fill Spacing (bottom layer, min spacing = 10 mils) | 99.3% | 240 | 3.84 | 99.3% | 99.3% |
| 9 | Flood Fill Spacing (top layer, min spacing = 10 mils) | 99.3% | 241 | 3.86 | 99.4% | 99.2% |
| 10 | Remove all decoupling caps except bulk decoupling | 98.9% | 251 | 3.82 | 99.4% | 98.9% |
| 11 | Remove bulk decoupling | 99.1% | 249 | 3.84 | 98.7% | 99.1% |
| 12 | Remove all decoupling >= 0.1 uF | 99.3% | 250 | 3.78 | 21.0% | 99.3% |
| 13 | Remove all decoupling < 0.1 uF | 99.2% | 248 | 3.84 | 99.2% | 99.3% |
| 14 | Add +/-10% randomly to lengths on equalized paths (top layer) | 99.3% | 251 | 3.85 | 99.4% | 99.4% |
| 15 | Add +/-10% randomly to lengths on equalized paths (bottom layer) | 99.4% | 252 | 3.79 | 99.3% | 99.5% |
| 16 | No ferrite beads | 99.4% | 250 | 145.00 | 99.5% | 99.4% |
| 17 | Oversize passive component pads by 10% | 99.2% | 249 | 3.82 | 99.3% | 99.5% |
| 18 | Undersize passive component pads by 10% | 72.1% | 251 | 3.86 | 99.3% | 99.3% |
| 19 | Oversize IC landing pads by 1 mil | 99.3% | 248 | 3.81 | 99.3% | 99.3% |
| 20 | Undersize IC landing pads by 1 mil | 98.8% | 249 | 3.84 | 99.4% | 99.4% |
| 21 | Inductor size -10% | 99.2% | 248 | 3.89 | 99.5% | 99.4% |

Fig. 10B

CHARACTERIZATION VEHICLES FOR PRINTED CIRCUIT BOARD AND SYSTEM DESIGN

RELATED APPLICATIONS

This application is a continuation of U.S. patent application Ser. No. 16/162,072 filed on Oct. 16, 2018 which is a non-provisional patent application of and claims priority to U.S. Provisional Application No. 62/657,039, filed 13 Apr. 2018, all of which are incorporated, in their entireties, by reference herein.

FIELD OF THE INVENTION

The present invention relates to characterization vehicles for printed circuit (PC) boards, and more particularly relates to characterizing, optimizing and/or monitoring PC board-based systems and processes for manufacturing same.

BACKGROUND

In a conventional characterization vehicle (CV), a plurality of test structures are fabricated on an integrated circuit (IC) chip. As is known in the art, an IC chip is typically formed by performing a series of processing steps (e.g., etching layers to form structures, doping layers with chemicals, and depositing materials on top of layers) on a semiconductor substrate (e.g., silicon substrate). Through such processing of the semiconductor substrate, an integrated circuit (comprising transistors, capacitors, resistors, etc. interconnected by conductive traces) is formed on and within the semiconductor substrate. An IC chip, once fabricated, is typically housed within a semiconductor package having pins or leads that electrically connect the IC chip to landing/bonding pads external to the semiconductor package.

Each test structure of the IC chip may be designed in accordance with a design of experiment (DOE). A key purpose of the DOE is to stress the manufacturing process by taking the test structures to process corners and beyond (e.g., by violating one or more design rules).

SUMMARY OF THE INVENTION

In accordance with one embodiment of the invention, a characterization vehicle may include a first test circuit and a second test circuit located on separate panels of a panelized printed circuit (PC) board. The first test circuit may be fabricated in accordance with a first plurality of design parameters, and the second test circuit may be fabricated in accordance with a second plurality of design parameters. The first plurality of design parameters and the second plurality of design parameters may be chosen in accordance with a design of experiment (DOE) concerning one or more design rules or design trade-offs such that at least two corresponding design parameters from the first and second test circuits have identical values, and at least two corresponding design parameters from the first and second test circuits have different values.

The first test circuit may be associated with a first test program for testing the first test circuit and the second test circuit may be associated with a second test program for testing the second test circuit. The first test program may be specified by a first set of input-output pairs, in which each of the input-output pairs of the first set define an expected output of the first test circuit for a given input to the first test circuit. The second test program may be specified by a second set of input-output pairs, in which each of the input-output pairs of the second set define an expected output of the second test circuit for a given input to the second test circuit. The first set of input-output pairs may be identical to the second set of input-output pairs, in which case one may infer that the first and second test circuits are designed to have the same functionality.

The design rules may include one or more of a minimum trace spacing, a minimum trace width, flood fill rules, or a number of layers. The design trade-offs may include one or more of a decoupling capacitor density, decoupling capacitor sizing, trace length equalization, clock tree distribution design, or power filtering.

These and other embodiments of the invention are more fully described in association with the drawings below.

BRIEF DESCRIPTION OF THE DRAWINGS

FIG. 3 depicts test programs used to test the first and second test circuits, and a comparison of measured output signals to expected output signals, in accordance with one embodiment of the invention.

FIG. 8A depicts a top view of a passive component electrically connected to landing (or component) pads.

FIG. 8B depicts a top view of an active component electrically connected to landing (or component) pads.

FIG. 9B depicts a table describing design parameters associated with each of the circuits depicted in FIG. 9A, in accordance with one embodiment of the invention.

FIG. 10A depicts a table of hypothetical results corresponding to a hypothetical scenario in which 1,000 instances of the panelized PC board depicted in FIG. 9A are fabricated by Factory A.

FIG. 10B depicts a table of hypothetical results corresponding to a hypothetical scenario in which 1,000 instances of the panelized PC board depicted in FIG. 9A are fabricated by Factory B.

DETAILED DESCRIPTION OF THE INVENTION

Figure 1:
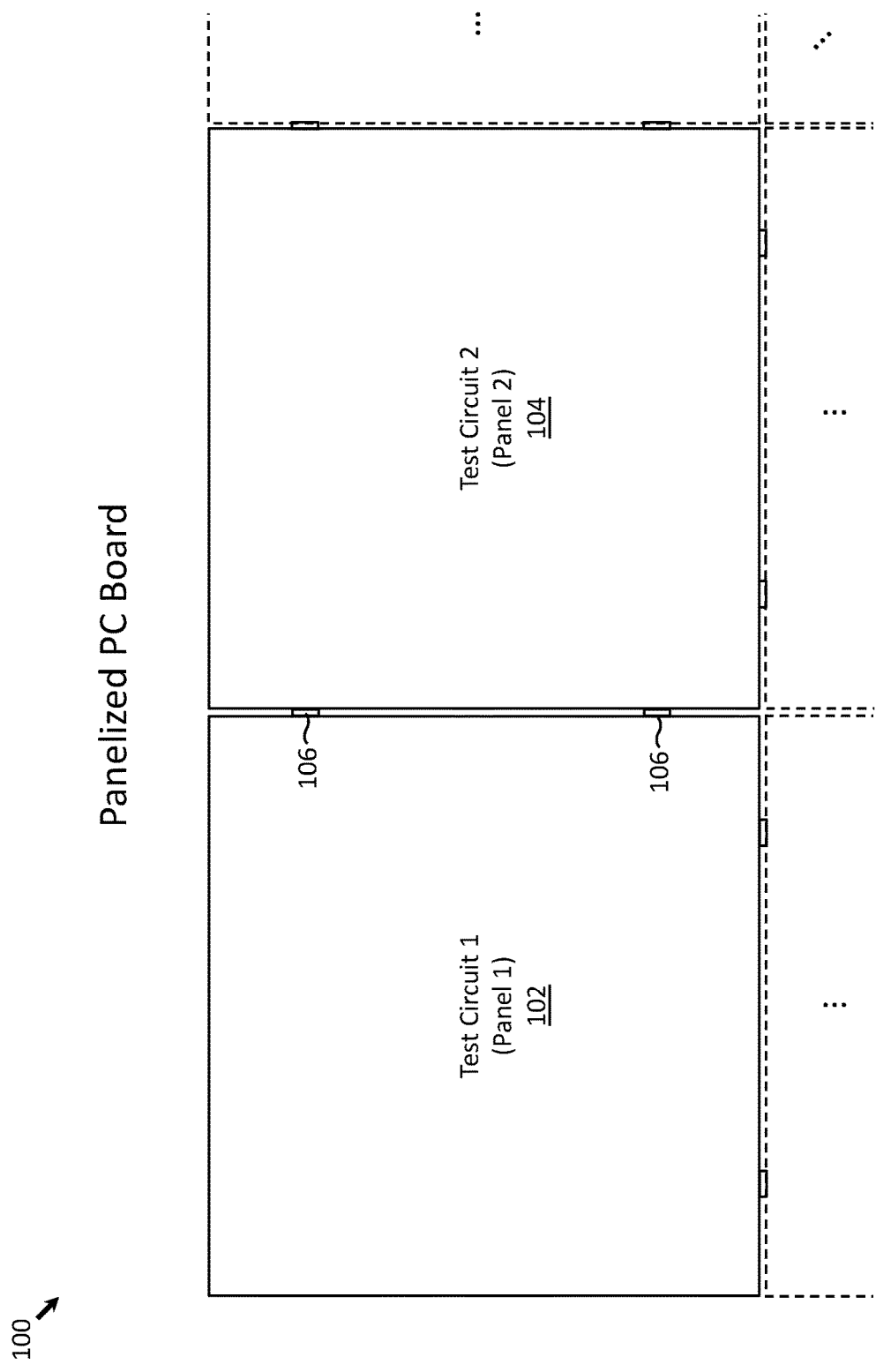
FIG. 1 depicts a top view of a portion of a panelized printed circuit (PC) board with a plurality of circuits, each of the circuits located on a separate panel of the panelized PC board, in accordance with one embodiment of the invention.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. Descriptions associated with any one of the figures may be applied to different figures containing like or similar components/steps. While the sequence diagrams each present a series of steps in a certain order, the order of some of the steps may be changed.

In a characterization vehicle (CV) instantiated as a panelized PC board, a plurality of test circuits (or test structures) may be fabricated on panels of the panelized PC board. As is known in the art, a PC board is typically formed by one or more substrate layers (e.g., FR4 glass epoxy), one or more layers of conductive traces (e.g., copper traces) located on or between the substrate layers, and electronic components interconnected by the conductive traces. The electronic components may include passive components (such as resistors, capacitors, inductors, etc.) or active components (such an IC chip). When passive and/or active components are mounted on the surface of the PC board, bonding pads and/or bonding wires may additional be present to electrically connect the passive and/or active component to the conductive traces.

A panelized PC board is typically formed by an array of equal-sized portions of the PC board that may be divided (i.e., mechanically cut) into individual PC boards, and each of these equal-sized portions may be called a "panel". However, in some instances, the portions may not be equally sized. Typically, adjacent panels of a panelized PC board are mechanically coupled together (via mechanical linkages between panels), but are not electrically communicatively coupled together (i.e., in the sense that one panel does not supply an electrical signal to an adjacent panel). In a CV instantiated as a panelized PC board, one test circuit is typically fabricated on one of the panels. Examples of a test circuit may include a USB hub, a server, a "bit slice" of a server, a cell phone, a voltage-controlled oscillator (VCO), an oscillator or a computing platform. The test circuits of interest must perform some processing of an input signal into an output signal (i.e., output signal of a test circuit is not simply a scale or attenuated version of the input signal provided to the test circuit).

Typically, all of the test circuits that are fabricated on separate panels of a panelized PC board are designed to have the same functionality. One way to determine whether two test circuits are designed to have the same functionality is by comparing the simulated functionality of the two test circuits. If the two test circuits return the same output vectors for the same input vectors (for all possible input vectors), the two test circuits may be determined as being designed to have the same functionality. If, however, the two test circuits return different output vectors for the same input vector, the two test circuits may be determined as being designed to have different functionality.

Another way to determine whether two test circuits are designed to have the same functionality is by comparing test programs for testing the two test circuits. Typically, a test program will include a set of input-output pairs, in which each of the input-output pairs define expected output of a test circuit for a given input to the test circuit. If the set of input-output pairs for a test program for a first test circuit is identical to the set of input-output pairs for a test program for a second test circuit, the two test circuits may also be determined as being designed to have the same functionality. If, however, the set of input-output pairs for a test program for a first test circuit is not identical to the set of input-output pairs for a test program for a second test circuit, the two test circuits may be determined as being designed to have different functionality.

While all of the test circuits that are fabricated on separate panels of a panelized PC board may be designed to have the same functionality, design parameters (e.g., minimum trace width, minimum trace spacing, minimum spacing between trace and flood fill, use of trace length equalization, etc.) may be varied between test circuits in order to characterize the sensitivity of one or more of a PC board manufacturing process, PC board components, or interactions between the PC board components and the PC board. By manufacturing the panelized PC boards at different factories, factory-to-factory instability and maturity can also be evaluated. It is noted that while all of the test circuits that are fabricated on separate panels of a panelized PC board may be designed to have the same functionality, due to the variation in the design parameters, some of the test circuits will function in accordance with their intended functionality, while some of the test circuits will not function in accordance with their intended functionality.

Design parameters may be varied between test circuits in a systematic experimentation methodology known as a design of experiment (DOE), in which typically one design parameter is varied between two test circuits and all other design parameters are kept the same between the two test circuits. In this way, any difference in functionality between the two test circuits can be attributed to the design parameter that was varied. For instance, the minimum trace width for a first test circuit may be set to 14 mils, whereas the minimum trace width for a second test circuit may be set to 10 mils (with all other design parameters being shared between the two test circuits). If the first test circuit is fully functional, but the second test circuit is not fully functional, an inference may be made that the manufacturing process being characterized cannot reliably manufacture traces with a width of 10 mils (assuming that both circuits were designed to be functional).

FIG. 1 depicts a top view of a portion of panelized PC board 100 with a plurality of test circuits. Each of the test circuits may be located on a separate panel of the panelized PC board. For example, test circuit 1 (elt. 102) may be located on panel 1 and test circuit 2 (elt. 104) may be located on panel 2. Panel 1 may have the same dimensions (e.g., length and width) as panel 2. Further, panel 1 may be mechanically coupled to panel 2 via mechanical linkages 106. In a production process (as opposed to a testing process), mechanical linkages 106 may be severed, upon which each of the panels becomes an individual PC board. However, in the testing process discussed herein, the mechanical linkages 106 are typically left intact and the plurality of panels are tested while still being attached to one another. Mechanical linkages 106 are only one example of linkages between panels. In another embodiment, adjacent panels may have no physical air gap between one another, and the boundary between adjacent panels may be in the form of a visible line drawn on the surface of the panelized PC board that divides one panel from another. For clarity of illustration, only panel 1 and panel 2 of panelized PC board 100 are depicted in FIG. 1, but it is understood that panelized PC board 100 may include numerous other panels (depicted in dotted lines).

Figure 2:
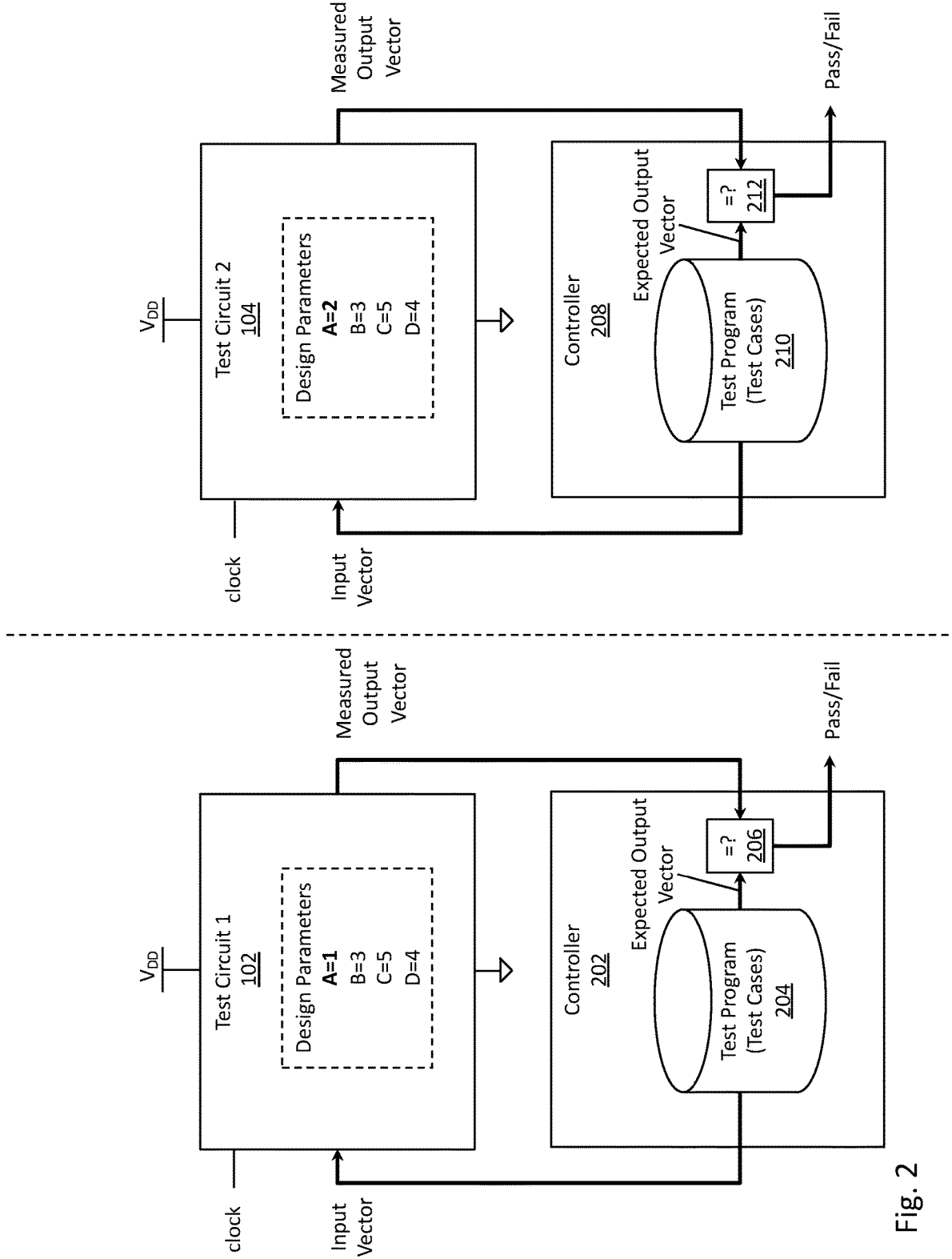
FIG. 2 depicts additional details of a first test circuit and a second test circuit of the PC board, and one or more controllers for testing the first and second test circuits, in accordance with one embodiment of the invention.

FIG. 2 depicts additional details of the first test circuit (elt. 102) and the second test circuit (elt. 104) of panelized PC board 100, and one or more controllers 202, 208 for testing the first and second test circuits. The first test circuit may include a number of terminals, among which may include one or more input terminals, a clock terminal (in the case that the first test circuit is a digital circuit), one or more power terminals ($V_{DD}$), one or more output terminals and a ground terminal. A similar description may apply to the terminals of the second test circuit.

Controller 202 may execute a test program stored in data store 204. The test program may comprise a plurality of test cases, and each of the test cases may include an input vector paired with an expected output vector. The expected output vector is the output that is expected from the first test circuit when the input vector is provided as input to the first test circuit. The input vector may be provided serially (i.e., provided as a sequence of binary values over time to a single input terminal) or at a single time instance (i.e., in a parallel fashion to a plurality of input terminals). Likewise, an output vector may be read serially from a single output terminal of the test circuit or at a single time instance from a plurality of output terminals. Further, the measured output vector may be compared to the expected output vector by comparator 206. If the vectors match, comparator 206 may indicate that the first test circuit has passed a particular test case; otherwise, comparator 206 may indicate that the first test circuit has failed a particular test case. A similar description may apply to controller 208, data store 210 and comparator 212 of the second test circuit.

It is noted that in many instances the first test circuit and the second test circuit will be designed to have the same functionality in spite of the variation in design parameters. Therefore, the test programs used to test the two test circuits may be identical, and certain modifications to FIG. 2 may be possible. For example, one datastore and one test program may be shared between the first and second test circuit. Further, if testing speed is not a concern, a single controller with a single test program may be used to test the first and second test circuit in series (e.g., testing the first test circuit followed by testing the second test circuit).

Lastly, FIG. 2 abstractly illustrates the design parameters varied in accordance with a DOE. All design parameters are common between the first test circuit and the second test circuit except for design parameter "A" (i.e., A=1 for the first test circuit, whereas A=2 for the second test circuit). While design parameters are described in an abstract manner in FIG. 2, subsequent figures will provide more concrete examples of the design parameters.

FIG. 3 depicts test programs 204 and 210 used to test the first and second test circuits, respectively. Test programs 204 and 210 each include five test cases. A simple inspection will reveal that test programs 204 and 210 are identical to one another, indicating that the first test circuit and the second test circuit are designed to have the same functionality. FIG. 3 also provides examples of the test circuits failing and passing individual test cases. For example, for the first test circuit, the expected output vector for test case 1 ("10101111") matched the measured output vector ("10101111"), indicating the first test circuit passing test case 1.

Figure 4:
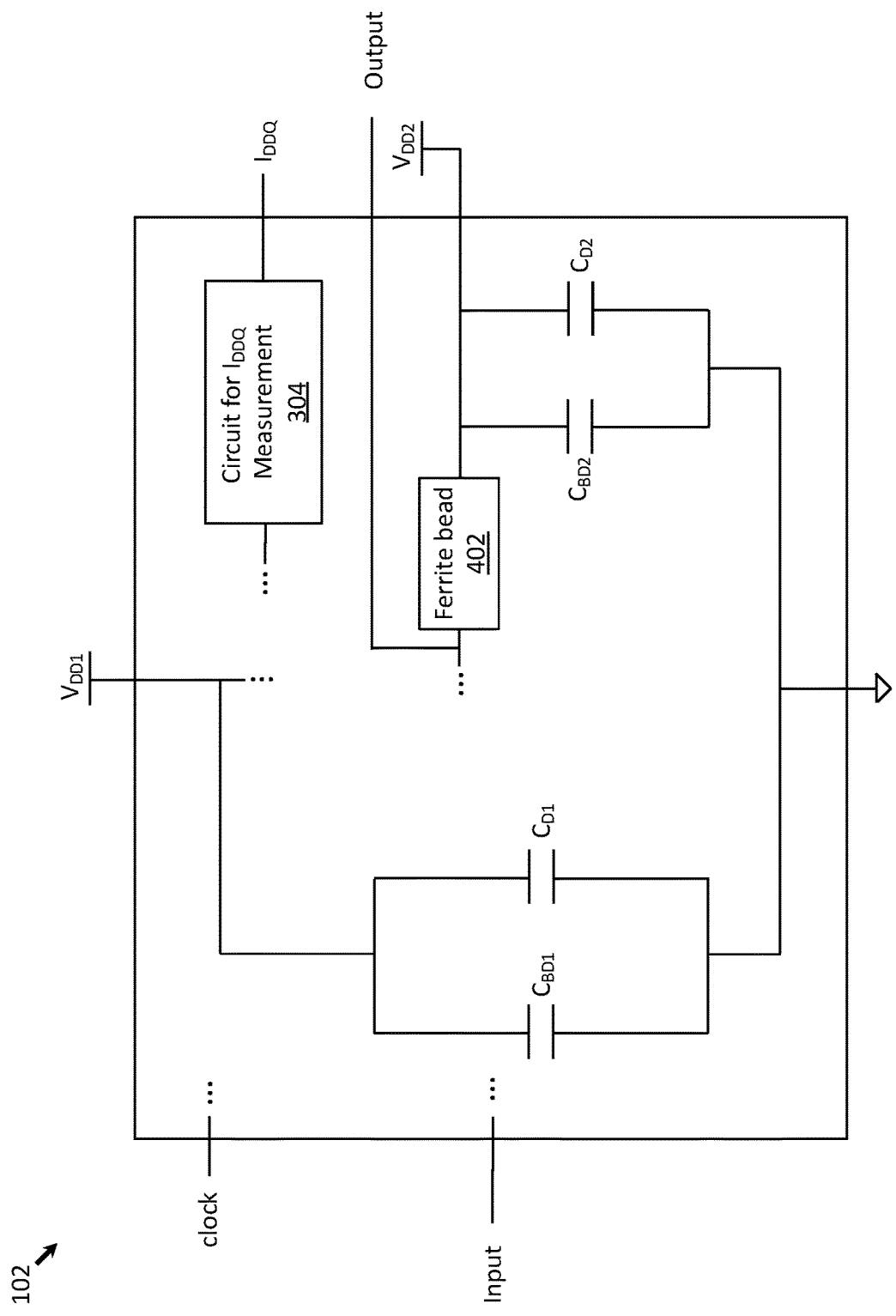
FIG. 4 depicts circuit components related to power filtering (i.e., filtering the electrical signal provided by the power supply) and a circuit for measuring the quiescent current of the power supply, in accordance with one embodiment of the invention.
Figure 9A:
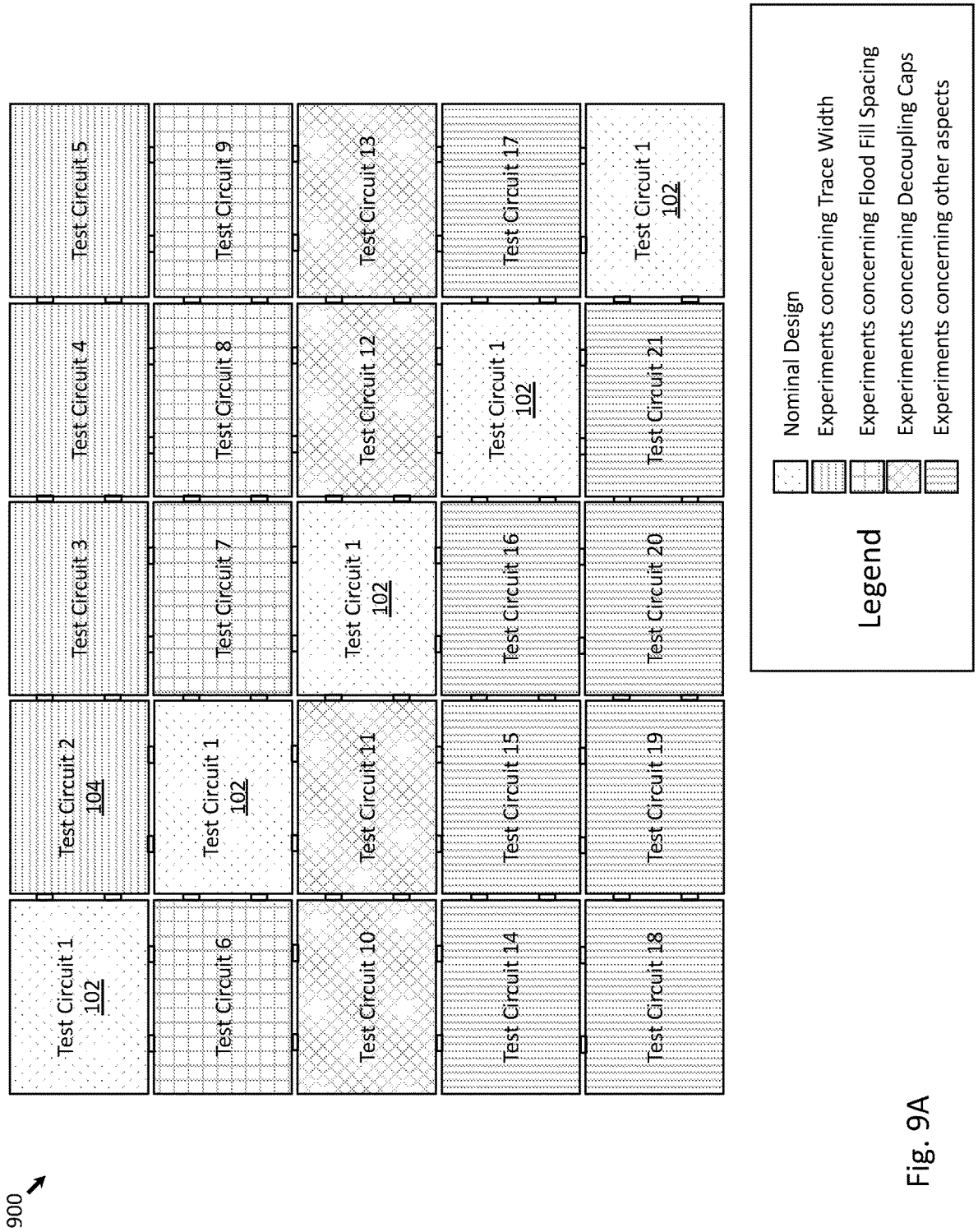
FIG. 9A depicts a top view of a panelized PC board with a plurality of circuits (each of the circuits located on a separate panel) that have been fabricated with design parameters that adhere to a design of experiment (DOE), in accordance with one embodiment of the invention.

FIGS. 4-8B describe certain design parameters, as background material for the DOE described in FIGS. 9A-9B. FIG. 4 depicts additional details of the first test circuit component (elt. 102), including circuit components related to power filtering (i.e., filtering the electrical signal provided by the power supply) and circuit 304 for measuring the quiescent current of the power supply ($I_{DDQ}$). In general, circuit 304 is connected to $V_{DD1}$. In the simplest embodiment, circuit 304 is directly connected to $V_{DD1}$. In a more complicated embodiment, circuit 304 is connected to $V_{DD1}$ via a sense resistor and amplifiers in order to boost the current that is measured by circuit 304.

Bulk decoupling capacitor ($C_{BD1}$) and decoupling capacitor ($C_{D1}$) may be used to remove high frequency noise from the power supply $V_{DD1}$ (since capacitors are a virtual short for high frequency signals). Also, bulk decoupling capacitor ($C_{BD1}$) may be used to supply current for tens of milliseconds and decoupling capacitor ($C_{D1}$) may be used to supply current for tens of nanoseconds, as needed. Bulk decoupling capacitor ($C_{BD2}$) and decoupling capacitor ($C_{D2}$) may likewise be used to remove high frequency noise from power supply $V_{DD2}$, which supplies power to the output terminal. Further, ferrite bead 302 (and/or an inductor, not depicted) may be used to isolate the output terminal from any high frequency noise that is present in power supply $V_{DD2}$. Design parameters may include the size of bulk decoupling, whether bulk decoupling is used or not used, a decoupling capacitor density (in the instance that a plurality of decoupling capacitors are spread out over a panel), the minimum decoupling capacitor size, whether ferrite beads are used or not used, whether inductors are used or not used, among other parameters associated with the power filtering, and such design parameters may be varied as part of a DOE.

While not depicted in FIG. 4, extra pads may be placed in the test circuit so as to allow interception of intermediary signals that might be present on a production circuit board (i.e., a circuit board that is produced for customers). For example, two ICs might be directly connected to each other via several traces on the production circuit board. Under normal testing conditions, one might not care about sensing the intermediate states in between these two ICs. However, in a test circuit, extra pads may be inserted in between these two ICs in order to permit a more detailed monitoring of the intermediate states.

Figure 5:
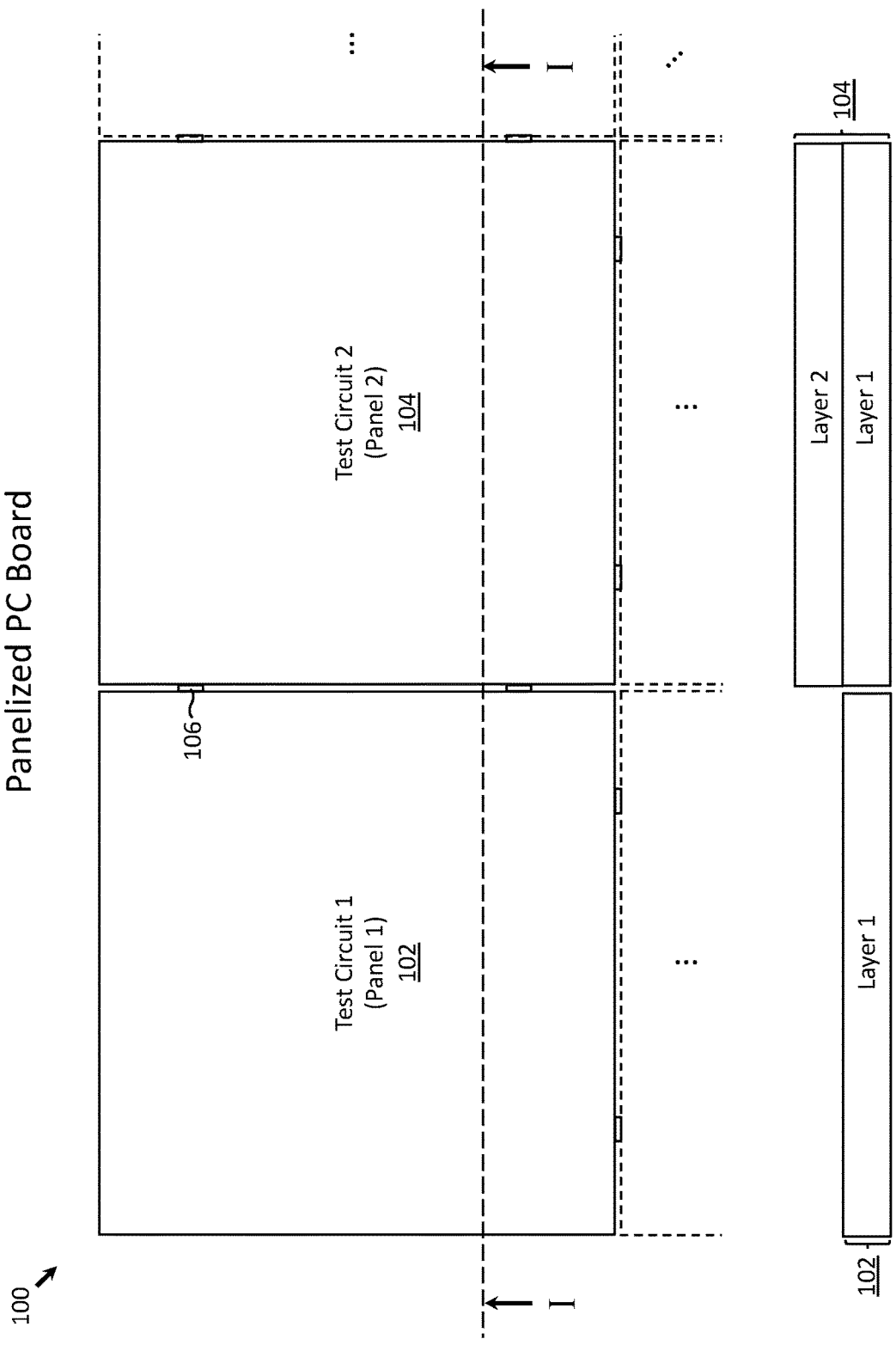
FIG. 5 depicts a top view and a cross-sectional view of a panelized PC board, in accordance with one embodiment of the invention.

FIG. 5 depicts a top view of panelized PC board 100, and a cross-sectional view of panelized PC board 100 along line I-I. In the example of FIG. 5, the first test circuit is constructed using a single layer (i.e., layer 1), whereas the second test circuit is constructed using two layers (i.e., layer 1 and layer 2). The number of layers of a PC board may be a design parameter, and may be varied as part of a DOE. Typical number of layers chosen in a DOE may include 2, 4, 6 and 8. For clarity, it is noted that the layers discussed herein refer to "active layers" with traces and other electrical interconnection. It is understood, however, that such layers are typically separated by dielectric layers which electrically isolate the active layers. Such dielectric layers are not included in the count of the number of layers.

Figure 6:
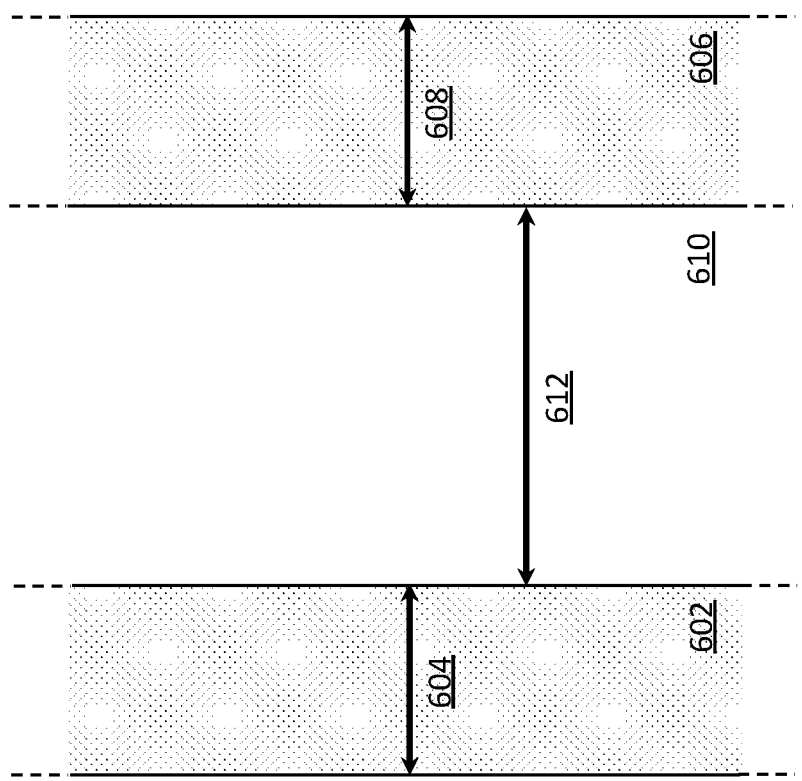
FIG. 6 depicts a top view of two parallel circuit traces separated from one another by a non-conductive region.

FIG. 6 depicts a top view of two parallel circuit traces 602, 606 separated from one another by non-conductive region 610. The width of circuit trace 602 is indicated by arrow 604; the width of circuit trace 606 is indicated by arrow 608; and the separation between circuit trace 602 and 606 is indicated by arrow 612. The minimum trace width, as well as the minimum separation between two adjacent traces may be design parameters, and may be varied as part of a DOE. For example, a DOE may specify a test circuit to be fabricated with a nominal minimum trace width (e.g., the minimum trace width specified by a manufacturing process), a circuit to be fabricated with the minimum trace width set to 90% of the nominal value, and a circuit to be fabricated with the minimum trace width set to 110% of the nominal value.

Another design parameter associated with circuit traces is whether length equalization is used or not used. Length equalization typically refers to selecting the proper lengths of two individual traces, such that a signal arrives at the respective ends of the two individual traces at the same time.

Another design parameter associated with circuit traces is whether length equalization is used or not used in the clock tree distribution (i.e., the distribution of the clock signal to various digital logic components). In an ideal scenario with length equalization, the clock skew would be 0 ps. In a DOE, the maximum clock skew could be set to be 100 ps or another value that a designer believes is enough to make the test circuit sufficiently unstable.

Figure 7:
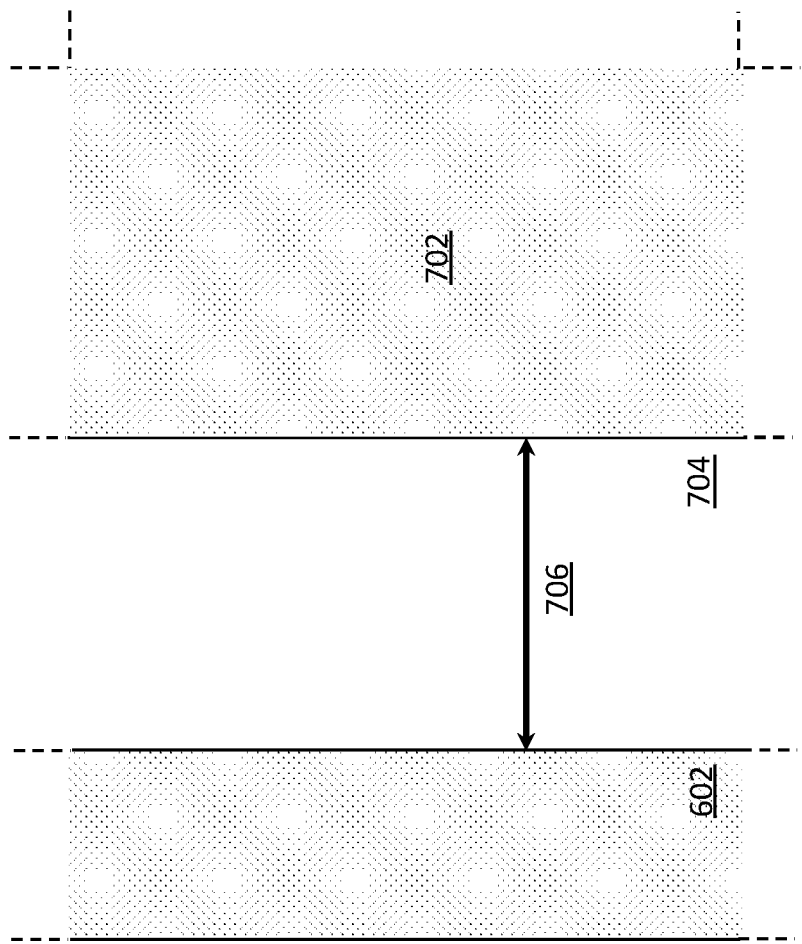
FIG. 7 depicts a top view of a circuit trace and a flood fill region separated from one another by a non-conductive region.

FIG. 7 depicts a top view of circuit trace 602 and flood fill region 702 separated from one another by non-conductive region 704. The separation between circuit trace 602 and flood fill region 702 is indicated by arrow 706. The minimum separation between a trace and an adjacent flood fill region may be a design parameter, and may be varied as part of a DOE. For example, a DOE may specify a test circuit to be fabricated with a nominal minimum trace to flood fill separation (e.g., the nominal separation specified by a manufacturing process), a test circuit to be fabricated with the minimum trace to flood fill separation set to 90% of the nominal value, and a test circuit to be fabricated with the minimum trace to flood fill separation set to 110% of the nominal value.

FIG. 8A depicts a top view of passive component 804 electrically connected to landing (or component) pads 802a and 802b via bonding wires or pins 806a and 806b, respectively. In one scenario, pin 806a may receive an input of passive component 804 and pin 806b may transmit an output of passive component 804. The size (e.g., length and width) of each of the landing pads may be a design parameter, and may be varied as part of a DOE. For example, a DOE may specify a test circuit to be fabricated with a nominal size for the landing pads of passive components, a test circuit to be fabricated with landing pads of passive components that are oversized by 10% relative to the nominal size, and a test circuit to be fabricated with landing pads of passive components that are undersized by 10% relative to the nominal size.

FIG. 8B depicts a top view of active component 810 electrically connected to landing (or component) pads 808a, 808b, 808c and 808d via bonding wires or pins 812a, 812b, 812c and 812d, respectively. In one scenario, pin 812a may be coupled to a power supply, pin 812b may be coupled to ground, pin 812c may receive an input signal and pin 812d may transmit an output signal. The size (e.g., length and width) of each of the landing pads may be a design parameter, and may be varied as part of a DOE. For example, a DOE may specify a test circuit to be fabricated with a nominal size for the landing pads of active components, a test circuit to be fabricated with landing pads of active components that are oversized by 1 mil relative to the nominal size, and a test circuit to be fabricated with landing pads of active components that are undersized by 1 mil relative to the nominal size.

FIG. 9A depicts a top view of panelized PC board 900 with a plurality of circuits (each of the circuits located on a separate panel) that have been fabricated with design parameters that have been chosen in accordance with a DOE. Test circuit 1 (elt. 102) represents a nominal design (i.e., the way a circuit designer originally intended the circuit to be designed). A plurality of panels (e.g., five panels in the example of FIG. 9A) may be fabricated with the nominal design. Test circuits 2 through 5 may include circuit designs in which the design parameter of a trace width has been varied. Test circuits 6 through 9 may include circuit designs in which the design parameter of flood fill spacing has been varied. Test circuits 10 through 13 may include circuit designs in which one or more design parameters concerning decoupling capacitors have been varied. Test circuits 14 through 21 may include circuit designs in which one or more other design parameters (e.g., concerning trace length equalization, use of ferrite beads, oversized/undersized component pads, etc.) have been varied.

While not employed in the example of FIG. 9A, test circuits (with identical function and design parameters) are typically replicated within one DOE. That is, two test circuits (on two separate panels) may be fabricated with identical function and design parameters. The purpose for such replication is to test for spatial effects over a PC board. For example, due to a manufacturing defect, trace widths in the lower left portion of a PC board may not be fabricated to a specified trace width and the replication of a test circuit in different spatial regions over a PC board may make such manufacturing defect more likely to be detected.

FIG. 9B depicts a table describing design parameters associated with each of the circuits depicted in FIG. 9A. As noted above, test circuit 1 may be a nominal circuit. Test circuit 2 may be a circuit in which the trace width of the top layer has been reduced by 10%. Test circuit 3 may be a circuit in which the trace width of the bottom layer has been reduced by 10%. Test circuit 4 may be a circuit in which the trace width of the top layer has been increased by 10%. Test circuit 5 may be a circuit in which the trace width of the bottom layer has been increased by 10%.

Test circuit 6 may be a circuit in which the minimum flood fill spacing (i.e., minimum spacing between flood fill and trace) of the bottom layer has been set to 5 mils. Test circuit 7 may be a circuit in which the minimum flood fill spacing of the top layer has been set to 5 mils. Test circuit 8 may be a circuit in which the minimum flood fill spacing of the bottom layer has been set to 10 mils. Test circuit 9 may be a circuit in which the minimum flood fill spacing of the top layer has been set to 10 mils.

Test circuit 10 may be a circuit in which all decoupling capacitors except bulk decoupling capacitors have been removed. Test circuit 11 may be a circuit in which all bulk decoupling capacitors have been removed. Test circuit 12 may be a circuit in which all decoupling capacitors greater than or equal to 0.1 µF have been removed. Test circuit 13 may be a circuit in which all decoupling capacitors less than 0.1 µF have been removed.

Test circuit 14 may be a circuit in which, for the top layer, trace lengths are varied randomly by +10% or −10% from their respective equalized lengths. Test circuit 15 may be a circuit in which, for the bottom layer, trace lengths are varied randomly by +10% or −10% from their respective equalized lengths.

Test circuit 16 may be a circuit in which ferrite beads (e.g., ferrite beads that are part of the power filtering) are not used.

Test circuit 17 may be a circuit in which passive component pads have been oversized by 10%. Test circuit 18 may be a circuit in which passive component pads have been undersized by 10%. Test circuit 19 may be a circuit in which IC landing pads have been oversized by 1 mil. Test circuit 20 may be a circuit in which IC landing pads have been undersized by 1 mil.

Test circuit 21 may be a circuit in which the size of the inductors (e.g., inductors that are part of the power filtering) have been reduced by 10%.

FIG. 10A depicts a table of hypothetical results corresponding to a hypothetical scenario in which 1,000 instances of the panelized PC board depicted in FIG. 9A are fabricated by Factory A. Factory A manufacturing 1,000 instances of the panelized PC board is just one example, and it is understood that other number of instances are possible (e.g., 100 instances, 500 instances, etc.). Row 1 of the table corresponding to test circuit 1 represents hypothetical test results constructed for the 1,000 instances of test circuit 1, and include the functional yield of 99.2% (i.e., 8 out of the 1000 instances had at least one test case that failed), the maximum clock speed of 236 MHz (i.e., the average (over 1,000 instances of test circuit 1) of the maximum clock speed for each of the instances of test circuit 1), the minimum quiescent current of 3.78 nA (i.e., the average (over 1000 instances of test circuit 1) of the minimum quiescent current for each of the instances of test circuit 1), the functional yield of 99.3% with the power supply voltage reduced by 10% and the functional yield of 99.2% with the power supply voltage increased by 10%. The last two columns may be interpreted as functional verification tests under voltage stress conditions. The remaining rows can be understood in a similar fashion.

Certain observations about the manufacturing process of Factory A can be made from the hypothetical results presented in FIG. 10A. For example, when the trace width is undersized on the top layer, the functional yield suffers (see functional yield of 87.3% for test circuit 2). When the decoupling capacitors are removed (particularly for large size capacitors) under reduced power supply voltage conditions, the functional yield suffers (see functional yield of 4.0% and 18.0% for test circuits 10 and 12, respectively). When the IC landing pads are undersized slightly, the functional yield suffers (see functional yield of 82.1% for test circuit 20). When the flood fill rules are adjusted, the maximum clock speed is dramatically affected (see maximum clock speeds of 179 MHz, 153 MHz, 262 MHz and 279 MHz for test circuits 6, 7, 8 and 9, respectively). When the top layer trace width is increased or when the inductors are undersized, the minimum $I_{DDQ}$ is increased substantially (see minimum $I_{DDQ}$ of 12.30 nA and 231.32 nA for test circuits 4 and 21, respectively).

FIG. 10B depicts a table of hypothetical results corresponding to a hypothetical scenario in which 1,000 instances of the PC board depicted in FIG. 9A are fabricated by Factory B. Certain observations about the manufacturing process of Factory B can be made from the hypothetical results presented in FIG. 10B. For example, when the passive component pads are undersized slightly, the functional yield suffers (see functional yield of 72.1% for test circuit 18). When the ferrite beads are removed, the minimum $I_{DDQ}$ is increased substantially (see minimum $I_{DDQ}$ of 145.00 nA for test circuit 16). When large decoupling capacitors are removed, under reduced power supply voltage conditions, the functional yield suffers (see functional yield of 21.0% for test circuit 12).

When comparing Factory-B results to Factory-A results, one may observe that Factory B is generally much less sensitive to variation in design parameters and thus is a better controlled factory. Based on these results, the factories could perform failure-analysis and understand the root cause(s) of the deviant results and in turn modify their manufacturing equipment and/or processes. Alternatively, the factories could implement stricter control measures associated with the sensitive design parameters so as to prevent the flow through of questionable circuits.

While not included in the examples of FIGS. 10A and 10B, other parameters may be measured and evaluated, including power consumption and maximum reliable speed (i.e., maximum reliable clock frequency). Also, at speed testing of the test circuits may be conducted, in which tests of the test circuits are conducted with the clock set at a nominal frequency. Testing could be performed under voltage stress conditions (described in FIGS. 10A and 10B for functional verification) and/or over temperature stress conditions.

While not discussed in the examples of FIGS. 10A and 10B, certain design parameters may be of interest when studying process variations that exist between two factories. These parameters may include solder vendor and type; reflow temperature and time, and dwell time; rest time between pick/place and reflow, stencil thickness and type, and pressure on stencil during solder paste application.

Figure 11:
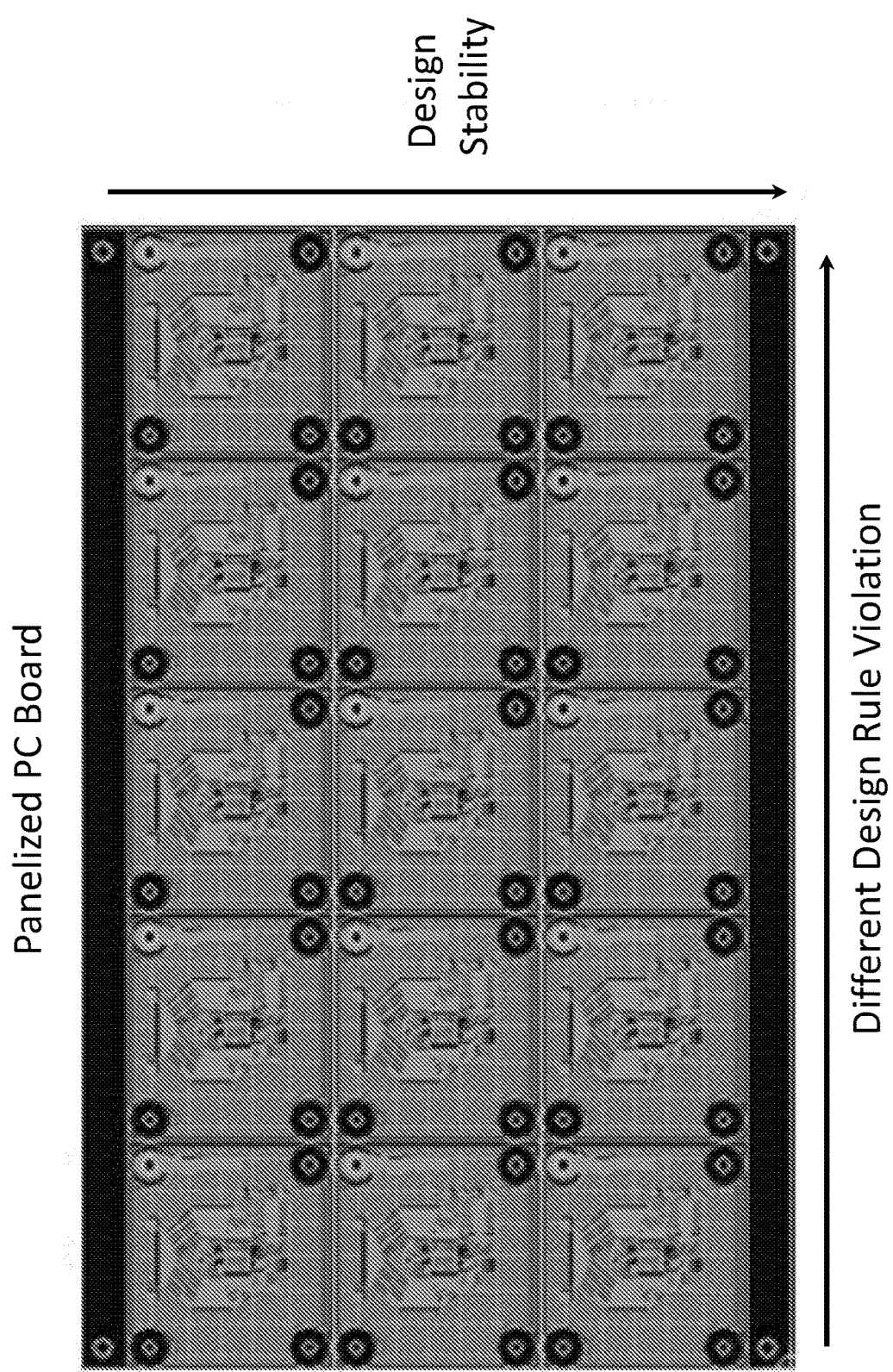
FIG. 11 depicts a top view of a panelized PC board, in accordance with one embodiment of the invention.

FIG. 11 depicts a top view of a panelized PC board, in accordance with one embodiment of the invention. The DOE generally perturbs the design stability and implements various design rule violations.

Figure 12:
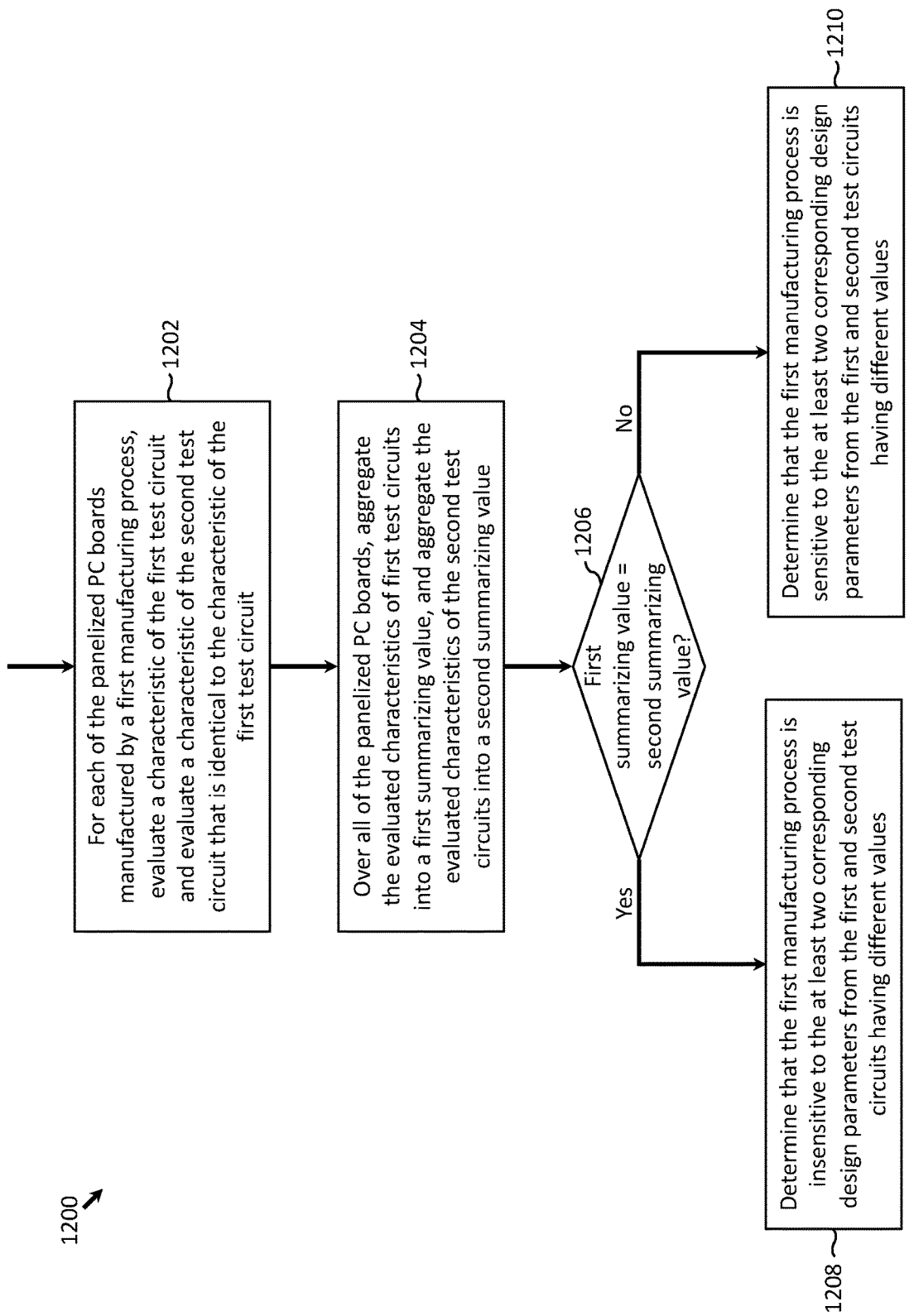
FIG. 12 depicts a flowchart of a process for evaluating a plurality of panelized PC boards (which are replicas of one another, except for manufacturing variations), in accordance with one embodiment of the invention.

FIG. 12 depicts flowchart 1200 of a process for evaluating a plurality of panelized PC boards manufactured by a first manufacturing process. The panelized PC boards may be replicas of one another, except for manufacturing variations. Each of the panelized PC boards may include at least a first test circuit and a second test circuit. The first test circuit may be fabricated in accordance with a first plurality of design parameters, and the second test circuit may be fabricated in accordance with a second plurality of design parameters. Further, the first plurality of design parameters and the second plurality of design parameters may adhere to a DOE concerning one or more design rules or design trade-offs such that at least two corresponding design parameters from the first and second test circuits have identical values, and at least two corresponding design parameters from the first and second test circuits have different values.

The first test circuit may be associated with a first test program for testing the first test circuit and the second test circuit may be associated with a second test program for testing the second test circuit. The first test program may be specified by a first set of input-output pairs, in which each of the input-output pairs of the first set define an expected output of the first test circuit for a given input to the first test circuit. The second test program may be specified by a second set of input-output pairs, in which each of the input-output pairs of the second set define an expected output of the second test circuit for a given input to the second test circuit. Further, the first set of input-output pairs may be identical to the second set of input-output pairs.

At step 1202, for each of the panelized PC boards, a characteristic of the first test circuit and a characteristic of the second test circuit that is identical to the characteristic of the first test circuit may be evaluated. The characteristic of the first test circuit may be whether the first test circuit is fully functional (e.g., whether the first test circuit passes all test cases of a test program), a power consumption of the first test circuit, a maximum clock speed of the first test circuit, or a minimum quiescent current of a power supply ($I_{DDQ}$) of the first test circuit.

At step 1204, over all of the panelized PC boards, the evaluated characteristics of first test circuits may be aggregated into a first summarizing value, and the evaluated characteristics of the second test circuits may be aggregated into a second summarizing value. An example of the first summarizing value may be 99.2% (i.e., the functional yield of the first test circuit), as provided in FIG. 10A. An example of the second summarizing value may be 87.3% (i.e., the functional yield of the second test circuit), as provided in FIG. 10A.

At step 1206, the first summarizing value may be compared to the second summarizing value. If the first summarizing value is substantially similar to the second summarizing value (e.g., values are within 5%, 10%, 15%, etc. of each other), a determination may be made (in step 1208) that the first manufacturing process is insensitive to the at least two corresponding design parameters from the first and second test circuits having different values. For example, based on the functional yield of the first test circuit being 99.2% and the functional yield of the fourth test circuit being 99.3% (as provided in FIG. 10A), it may be determined that the first manufacturing process is insensitive to the trace width of the top layer being oversized.

Otherwise, if the first summarizing value is not substantially similar to the second summarizing value, a determination may be made (in step 1210) that the first manufacturing process is sensitive to the at least two corresponding design parameters from the first and second test circuits having different values. For example, based on the functional yield of the first test circuit being 99.2% and the functional yield of the second test circuit being 87.3% (as provided in FIG. 10A), it may be determined that the first manufacturing process is sensitive the trace width of the top layer being undersized.

Figure 13:
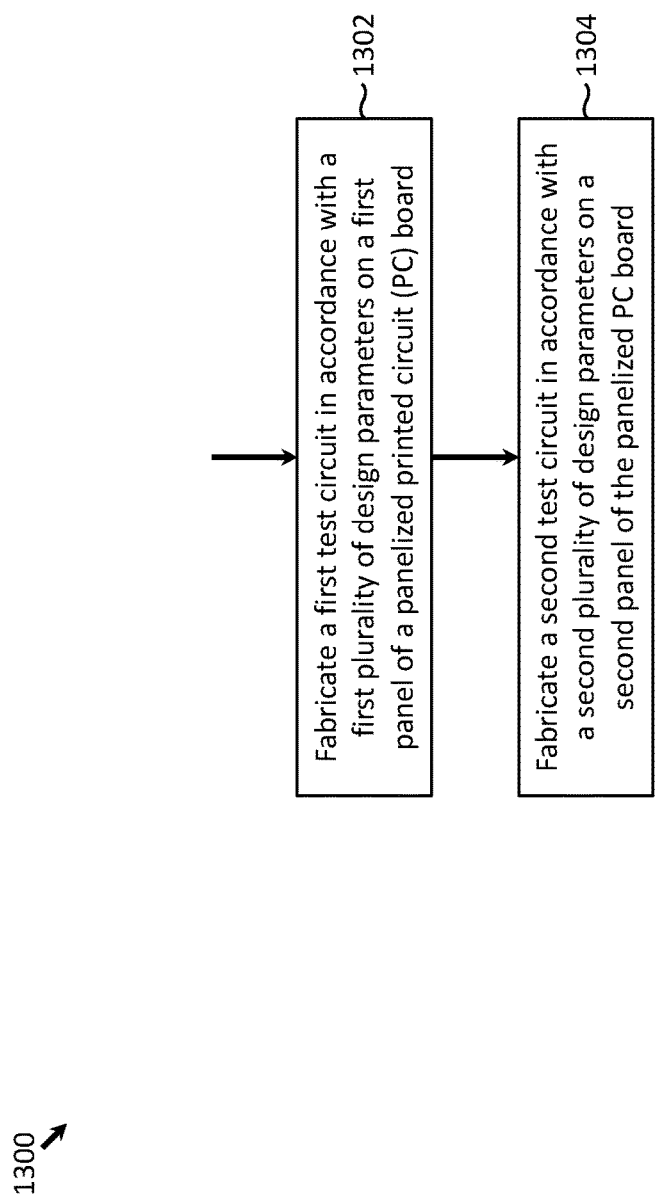
FIG. 13 depicts a flowchart of a process for fabricating a panelized PC board, in accordance with one embodiment of the invention.

FIG. 13 depicts flowchart 1300 of a process for fabricating a panelized PC board (i.e., a PC board characterization vehicle). In step 1302, a first test circuit may be fabricated in accordance with a first plurality of design parameters on a first panel of a panelized PC board. In step 1304, a second test circuit may be fabricated in accordance with a second plurality of design parameters on a second panel of the panelized PC board. While flowchart 1300 only describes the fabrication of two test circuits for simplicity, it is understood that typically a larger number of test circuits are fabricated, one on each panel of the panelized PC board.

Figure 14:
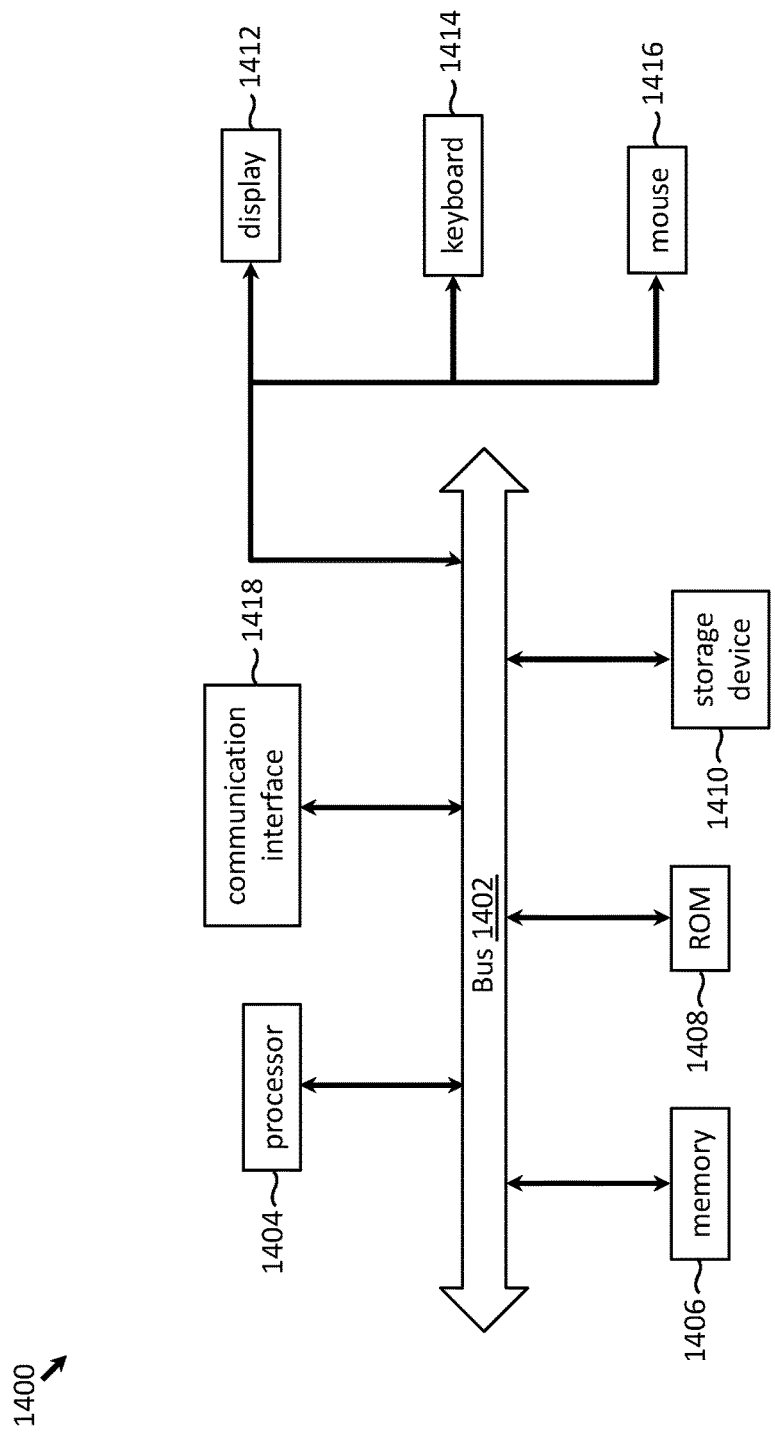
FIG. 14 depicts components of a computer system in which computer readable instructions instantiating the methods of the present invention may be stored and executed.

As is apparent from the foregoing discussion, aspects of the present invention involve the use of various computer systems and computer readable storage media having computer-readable instructions stored thereon. FIG. 14 provides an example of a system 1400 that may be representative of any of the computing systems (e.g., controllers 202, 208 depicted in FIG. 2) discussed herein. Examples of system 1400 may include a smartphone, a desktop, a laptop, a mainframe computer, an embedded system, etc. Note, not all of the various computer systems have all of the features of system 1400. For example, certain ones of the computer systems discussed above may not include a display inasmuch as the display function may be provided by a client computer communicatively coupled to the computer system or a display function may be unnecessary. Such details are not critical to the present invention.

System 1400 includes a bus 1402 or other communication mechanism for communicating information, and a processor 1404 coupled with the bus 1402 for processing information. Computer system 1400 also includes a main memory 1406, such as a random access memory (RAM) or other dynamic storage device, coupled to the bus 1402 for storing information and instructions to be executed by processor 1404. Main memory 1406 also may be used for storing temporary variables or other intermediate information during execution of instructions to be executed by processor 1404. Computer system 1400 further includes a read only memory (ROM) 1408 or other static storage device coupled to the bus 1402 for storing static information and instructions for the processor 1404. A storage device 1410, for example a hard disk, flash memory-based storage medium, or other storage medium from which processor 1404 can read, is provided and coupled to the bus 1402 for storing information and instructions (e.g., operating systems, applications programs and the like).

Computer system 1400 may be coupled via the bus 1402 to a display 1412, such as a flat panel display, for displaying information to a computer user. An input device 1414, such as a keyboard including alphanumeric and other keys, may be coupled to the bus 1402 for communicating information and command selections to the processor 1404. Another type of user input device is cursor control device 1416, such as a mouse, a trackpad, or similar input device for communicating direction information and command selections to processor 1404 and for controlling cursor movement on the display 1412. Other user interface devices, such as microphones, speakers, etc. are not shown in detail but may be involved with the receipt of user input and/or presentation of output.

The processes referred to herein may be implemented by processor 1404 executing appropriate sequences of computer-readable instructions contained in main memory 1406. Such instructions may be read into main memory 1406 from another computer-readable medium, such as storage device 1410, and execution of the sequences of instructions contained in the main memory 1406 causes the processor 1404 to perform the associated actions. In alternative embodiments, hard-wired circuitry or firmware-controlled processing units may be used in place of or in combination with processor 1404 and its associated computer software instructions to implement the invention. The computer-readable instructions may be rendered in any computer language.

In general, all of the above process descriptions are meant to encompass any series of logical steps performed in a sequence to accomplish a given purpose, which is the hallmark of any computer-executable application. Unless specifically stated otherwise, it should be appreciated that throughout the description of the present invention, use of terms such as "processing", "computing", "calculating", "determining", "displaying", "receiving", "transmitting" or the like, refer to the action and processes of an appropriately programmed computer system, such as computer system 1400 or similar electronic computing device, that manipulates and transforms data represented as physical (electronic) quantities within its registers and memories into other data similarly represented as physical quantities within its memories or registers or other such information storage, transmission or display devices.

Computer system 1400 also includes a communication interface 1418 coupled to the bus 1402. Communication interface 1418 may provide a two-way data communication channel with a computer network, which provides connectivity to and among the various computer systems discussed above. For example, communication interface 1418 may be a local area network (LAN) card to provide a data communication connection to a compatible LAN, which itself is communicatively coupled to the Internet through one or more Internet service provider networks. The precise details of such communication paths are not critical to the present invention. What is important is that computer system 1400 can send and receive messages and data through the communication interface 1418 and in that way communicate with hosts accessible via the Internet. It is noted that the components of system 1400 may be located in a single device or located in a plurality of physically and/or geographically distributed devices.

Thus, characterization vehicles for PC board and system design have been described. It is to be understood that the above-description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A characterization vehicle, comprising:
    a first test circuit located on a first panel of a panelized substrate of a printed circuit (PC) board; and
    a second test circuit located on a second panel of the panelized substrate of the PC board, wherein:
    (i) the first test circuit is fabricated in accordance with a first plurality of design parameters,
    (ii) the second test circuit is fabricated in accordance with a second plurality of design parameters,
    (iii) the first plurality of design parameters and the second plurality of design parameters adhere to a design of experiment (DOE) concerning one or more design rules or design trade-offs such that at least two corresponding design parameters from the first and second test circuits have identical values, and at least two corresponding design parameters from the first and second test circuits have different values,
    (iv) the first test circuit is associated with a first test program for testing the first test circuit and the second test circuit is associated with a second test program for testing the second test circuit,
    (v) the first test program is specified by a first set of input-output pairs, in which each of the input-output pairs of the first set define an expected output of the first test circuit for a given input to the first test circuit,
    (vi) the second test program is specified by a second set of input-output pairs, in which each of the input-output pairs of the second set define an expected output of the second test circuit for a given input to the second test circuit, and
    (vii) the first set of input-output pairs is identical to the second set of input-output pairs.

2. The characterization vehicle of claim 1, wherein the design rules include one or more of a minimum trace spacing, a minimum trace width, flood fill rules, or a number of layers.

3. The characterization vehicle of claim 2, wherein for the DOE concerning the design rule of minimum trace spacing, the minimum trace spacing of the first test circuit differs from the minimum trace spacing of the second test circuit.

4. The characterization vehicle of claim 2, wherein for the DOE concerning the design rule of minimum trace width, the minimum trace width of the first test circuit differs from the minimum trace width of the second test circuit.

5. The characterization vehicle of claim 2, wherein for the DOE concerning the design rule of flood fill rules, a minimum spacing between flood fill regions and traces of the first test circuit differs from a minimum spacing between flood fill regions and traces of the second test circuit.

6. The characterization vehicle of claim 2, wherein for the DOE concerning the design rule of the number of layers, a number of layers of the first test circuit differs from a number of layers of the second test circuit.

7. The characterization vehicle of claim 1, wherein the design trade-offs include one or more of a decoupling capacitor density, decoupling capacitor sizing, trace length equalization, clock tree distribution design, or power filtering.

8. The characterization vehicle of claim 7, wherein for the DOE concerning the design trade-off of the decoupling capacitor density, a decoupling capacitor density of the first test circuit differs from a decoupling capacitor density of the second test circuit.

9. The characterization vehicle of claim 7, wherein for the DOE concerning the design trade-off of decoupling capacitor sizing, a minimum decoupling capacitor size of the first test circuit differs from a minimum decoupling capacitor size of the second test circuit.

10. The characterization vehicle of claim 7, wherein for the DOE concerning the design trade-off of trace length equalization, the first test circuit includes trace length equalization, whereas the second test circuit does not include trace length equalization.

11. The characterization vehicle of claim 7, wherein for the DOE concerning the design trade-off of clock tree distribution design, a maximum clock skew of the first test circuit differs from a maximum clock skew of the second test circuit.

12. The characterization vehicle of claim 7, wherein for the DOE concerning the design trade-off of power filtering, at least one of (i) a size of a bulk decoupling capacitor of a power supply of the first test circuit differs from a size of a bulk decoupling capacitor of a power supply of the second test circuit, (ii) an inductor is used in the power supply of the first test circuit, but is not used in the power supply of the second test circuit, or (iii) a ferrite bead is used in the power supply of the first test circuit, but is not used in the power supply of the second test circuit.

13. A method for evaluating a plurality of panelized substrates of a plurality of printed circuit (PC) boards manufactured by a first manufacturing process, each of the panelized substrates of the PC boards comprising a first and second test circuit located on separate panels of the respective panelized substrates of the panelized PC boards, wherein (i) the first test circuit is fabricated in accordance with a first plurality of design parameters, (ii) the second test circuit is fabricated in accordance with a second plurality of design parameters, (iii) the first plurality of design parameters and the second plurality of design parameters adhere to a design of experiment (DOE) concerning one or more design rules or design trade-offs such that at least two corresponding design parameters from the first and second test circuits have identical values, and at least two corresponding design parameters from the first and second test circuits have different values, (iv) the first test circuit is associated with a first test program for testing the first test circuit and the second test circuit is associated with a second test program for testing the second test circuit, (v) the first test program is specified by a first set of input-output pairs, in which each of the input-output pairs of the first set define an expected output of the first test circuit for a given input to the first test circuit, (vi) the second test program is specified by a second set of input-output pairs, in which each of the input-output pairs of the second set define an expected output of the second test circuit for a given input to the second test circuit, and (vii) the first set of input-output pairs is identical to the second set of input-output pairs, the method comprising:

for each of the panelized substrates of the respective panelized PC boards, evaluating a characteristic of the first test circuit and a characteristic of the second test circuit that is identical to the characteristic of the first test circuit;

over all of the panelized substrates of the respective panelized PC boards, aggregating the evaluated characteristics of first test circuits into a first summarizing value, and aggregating the evaluated characteristics of the second test circuits into a second summarizing value; and if the first summarizing value is substantially similar to the second summarizing value, determining that the first manufacturing process is insensitive to the at least two corresponding design parameters from the first and second test circuits having different values; otherwise, if the first summarizing value is not substantially similar to the second summarizing value, determining that the first manufacturing process is sensitive to the at least two corresponding design parameters from the first and second test circuits having different values.

14. The method of claim 13, wherein the characteristic of the first test circuit comprises whether the first test circuit passes all test cases of a test program associated with the first test circuit, a power consumption of the first test circuit, a maximum clock speed of the first test circuit, or a minimum quiescent current of a power supply ($I_{DDQ}$) of the first test circuit.

15. The method of claim 13, wherein the design rules include one or more of a minimum trace spacing, a minimum trace width, flood fill rules, or a number of layers.

16. The method of claim 13, wherein the design trade-offs include one or more of a decoupling capacitor density, a decoupling capacitor sizing, trace length equalization, clock tree distribution designs, or power filtering.

17. A method for fabricating a characterization vehicle, the method comprising:

fabricating a first test circuit in accordance with a first plurality of design parameters on a first panel of a panelized printed circuit (PC) board; and fabricating a second test circuit in accordance with a second plurality of design parameters on a second panel of the panelized substrate of the panelized PC board, wherein (i) the first plurality of design parameters and the second plurality of design parameters adhere to a design of experiment (DOE) concerning one or more design rules or design trade-offs such that at least two corresponding design parameters from the first and second test circuits have identical values, and at least two corresponding design parameters from the first and second test circuits have different values, (ii) the first test circuit is associated with a first test program for testing the first test circuit and the second test circuit is associated with a second test program for testing the second test circuit, (iii) the first test program is specified by a first set of input-output pairs, in which each of the input-output pairs of the first set define an expected output of the first test circuit for a given input to the first test circuit, (iv) the second test program is specified by a second set of input-output pairs, in which each of the input-output pairs of the second set define an expected output of the second test circuit for a given input to the second test circuit, and (v) the first set of input-output pairs is identical to the second set of input-output pairs.

18. The method of claim 17, wherein the design rules include one or more of a minimum trace spacing, a minimum trace width, flood fill rules, or a number of layers.

19. The method of claim 17, wherein the design trade-offs include one or more of a decoupling capacitor density, decoupling capacitor sizing, length equalization, clock tree distribution designs, or power filtering.

\* \* \* \* \*